United States Patent
Chen

(10) Patent No.: US 9,558,701 B2
(45) Date of Patent: Jan. 31, 2017

(54) SHIFT REGISTER, INTEGRATED GATE LINE DRIVING CIRCUIT, ARRAY SUBSTRATE AND DISPLAY

(71) Applicant: BEIJING BOE OPTOELECTRONICS TECHNOLOGY CO., LTD., Beijing (CN)

(72) Inventor: Xi Chen, Beijing (CN)

(73) Assignee: BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 108 days.

(21) Appl. No.: 14/049,441

(22) Filed: Oct. 9, 2013

(65) Prior Publication Data

US 2014/0098013 A1    Apr. 10, 2014

(30) Foreign Application Priority Data

Oct. 9, 2012    (CN) .......................... 2012 1 0380699

(51) Int. Cl.
*G09G 3/36*    (2006.01)
*G11C 19/28*   (2006.01)

(52) U.S. Cl.
CPC .......... *G09G 3/3648* (2013.01); *G09G 3/3677* (2013.01); *G11C 19/28* (2013.01); *G09G 2310/0286* (2013.01)

(58) Field of Classification Search
None
See application file for complete search history.

(56) References Cited

U.S. PATENT DOCUMENTS

| | | | |
|---|---|---|---|
| 2007/0040792 A1* | 2/2007 | Kwag et al. | 345/100 |
| 2008/0297449 A1* | 12/2008 | Yamashita et al. | 345/76 |
| 2010/0245301 A1* | 9/2010 | Shang | 345/204 |
| 2012/0256817 A1 | 10/2012 | Chen et al. | |
| 2014/0086379 A1* | 3/2014 | Ma et al. | 377/64 |

FOREIGN PATENT DOCUMENTS

| | | |
|---|---|---|
| CN | 102651186 A | 8/2012 |
| CN | 102654986 A | 9/2012 |

OTHER PUBLICATIONS

First Chinese Office Action Appln. No. 201210380699.X; Dated Sep. 19, 2014.
Second Chinese Office Action Appln. No. 201210380699.X; Dated Feb. 11, 2015.

* cited by examiner

*Primary Examiner* — Chad Dicke
(74) *Attorney, Agent, or Firm* — Ladas & Parry LLP

(57) ABSTRACT

A shift register an integrated gate line driving circuit, an array substrate and a display are disclosed. Two electronic switching modules are added to the existing shift register, wherein one of the two electronic switching modules is arranged among a puling-down node, a low level signal terminal and a pulling-up node, and the other is arranged among the pulling-down node, the low level signal terminal and a signal output terminal; during the non-operating time of the shift register and when the pulling-down node is at a low level, the two electronic switching modules are turned on, and discharge the pulling-up node and the signal output terminal respectively to pull down the noise voltage, thereby effectively reducing the noise interference of the shift register during the non-operating time.

13 Claims, 6 Drawing Sheets

SHIFT REGISTER, INTEGRATED GATE LINE DRIVING CIRCUIT, ARRAY SUBSTRATE AND DISPLAY

TECHNICAL FIELD

The disclosures relates to the field of display technique, and particularly to a shift register, an integrated gate line driving circuit, an array substrate and a display.

BACKGROUND

In a Thin Film Transistor Liquid Crystal Display, generally, gates of individual Thin Film Transistors (TFTs) in a pixel area are supplied with gate driving signals by a gate driving apparatus. The gate driving apparatus can be formed on an array substrate of a Liquid Crystal Display with an array process, and such an integrated process can save the cost and also achieve a perfect appearance design of Liquid Crystal Panel with two sides thereof being symmetric. At the same time, the integrated process can omit a Bonding area and a Fan-out wiring space for the Integrated Gate Line Driving Circuit, and thus it can achieve a design of a narrow frame; moreover, said integrated process can also omit the Bonding process applied in the direction of gate lines, thus improving productivity and yield rate.

FIG. 1 shows a circuit diagram of one of shift registers constituting an integrated gate line driving circuit in the prior art; as shown in FIG. 1 the shift register includes four Thin Film Transistors T101, T102, T103 and T104 as well as a capacitor C102. FIG. 2 shows a timing sequence diagram of signals at inputs and outputs of the shift register shown in FIG. 1. The operating principle of the shift register can be described as follows: during the first phase, an input signal at a signal input terminal (INPUT) of the shift register is at a high level, and an input signal at a reset signal terminal (RESETIN) is at a low level, and thus T103 is switched on and T104 is switched off, a node PU is charged to a high level via T103; during the second phase, the input signal at the signal input terminal (INPUT) of the shift register is at a low level, the input signal at the reset signal terminal (RESETIN) is at a low level, and an input signal at a clock signal terminal (CLKIN) of the shift register is at a high level, and thus T101 is switched on, and a signal output terminal (OUTPUT) of the shift register is at a high level; moreover, since the input signal at the reset signal terminal (RESETIN) is at a low level, T102 and T104 are switched off; at this point, the node PU is in a floating state, and the level at the node PU continues to rise on the basis of the level during the first phase after coupling to the node PU via C102; during the third phase, the input signal at the signal input terminal (INPUT) of the shift register is at a low level, the input signal at the reset signal terminal (RESETIN) is at a high level, and thus T102 and T104 are switched on; as the sources of T102 and T104 are connected to a low level signal terminal (VSSIN), the signal output terminal (OUTPUT) and the node PU are at a low level; during the fourth phase, the input signal at the signal input terminal (INPUT) is at a low level, the input signal at the reset signal terminal (RESETIN) is at a low level, and thus T101, T102, T103 and T104 are switched off, the node PU is at a low level, and the signal output terminal (OUTPUT) remains at a low level; and during the fifth phase, the input signal at the signal input terminal (INPUT) is at a low level, the input signal at the reset signal terminal (RESETIN) is at a low level, all the transistors remain the state during the fourth phase, and thus the signal output terminal (OUTPUT) is still at a low level.

It can be seen that in a case of all of the signal input terminal (INPUT), the reset signal terminal (RESETIN) and the signal output terminal (OUTPUT) being at a low level, the clock signal terminal (CLKIN) is coupled to the node PU via a parasitic capacitance $C_{gd1}$ of T101 when it is at a high level so that the drain current of T101 increases, and thus the potential at the signal output terminal (OUTPUT) rises; moreover, since all of T103, T104 and T102 are switched off during the non-operating time, there is no pulling-down transistor to pull down the voltage at the signal output terminal (OUTPUT) when the potential at the signal output terminal (OUTPUT) rises due to the influence of the terminal CLKIN, thus bigger noise occurring in the signal output from the signal output terminal (OUTPUT).

SUMMARY

The embodiments of the present invention provide a shift register, an integrated gate line driving circuit, an array substrate and a display, for reducing noise interference of the shift register in a non-operating time.

A shift register provided in the embodiment of the present invention comprises a first Thin Film Transistor (TFT) having a gate and a drain connected to a signal input terminal, a source connected to a pulling-up node; a second TFT having a gate connected to a reset signal terminal, a drain connected to the pulling-up node, and a source connected to a low level signal terminal; a third TFT having a gate connected to the pulling-up node, a drain connected to a clock signal terminal, and a source connected to a signal output terminal; a fourth TFT having a gate connected to the reset signal terminal, a drain connected to the signal output terminal, and a source connected to the low level signal terminal; a capacitor being connected between the pulling-up node and the signal output terminal; the shift register further comprises:

a first electronic switching module, being connected between the pulling-up node and the low level signal terminal, and connected to a pulling-down signal terminal via the pulling-down node, for maintaining the pulling-up node at a low level during the non-operating time of the shift register and when the pulling-down node is at a low level; and/or a second electronic switching module, being connected between the signal output terminal and the low level signal terminal, and connected to the pulling-down signal terminal via the pulling-down node, for maintaining the signal output terminal at a low level during the non-operating time of the shift register and when the pulling-down node is at a low level.

An integrated gate line driving circuit provided in an embodiment of the present invention comprises a plurality of shift registers connected in series provided in the embodiments of the present invention, wherein except the first shift register and the last shift register, each of the other shift registers inputs a trigging triggering signal to a signal input terminal of next adjacent shift register, and inputs a reset signal to a reset signal terminal of previous adjacent shift register; the first shift register inputs a trigging signal to a signal input terminal of the second shift register, and the last shift register inputs a reset signal to the reset signal terminal of its own and to the reset signal terminal of previous shift register.

Further, an array substrate is provided in an embodiment of the present invention, comprising the integrated gate line driving circuit provided in the embodiments of the present invention.

Further, a display is provided in an embodiment of the present invention, comprising the array substrate provided in the embodiments of the present invention.

By means of the embodiments of the present invention, the following beneficial effects can be achieved:

In the shift register, the integrated gate line driving circuit, the array substrate and the display, two electronic switching modules are added to the existing shift register, wherein one of the two electronic switching modules is arranged among the puling-down node, the low level signal terminal and the pulling-up node, and the other is arranged among the pulling-down node, the low level signal terminal and the signal output terminal; during the non-operating time of the shift register and when the pulling-down node is at a low level, the two electronic switching modules are turned on, and discharge the pulling-up node and the signal output terminal respectively to pull down the noise voltage therein, thus effectively reducing the noise interference of the shift register during the non-operating time.

DETAILED DESCRIPTION OF THE PREFERRED EMBODIMENTS

Hereinafter, the shift register, the integrated gate line driving circuit, the array substrate and the display provided in the embodiments of the present invention are described in detail with reference to the Figures.

Figure 1:
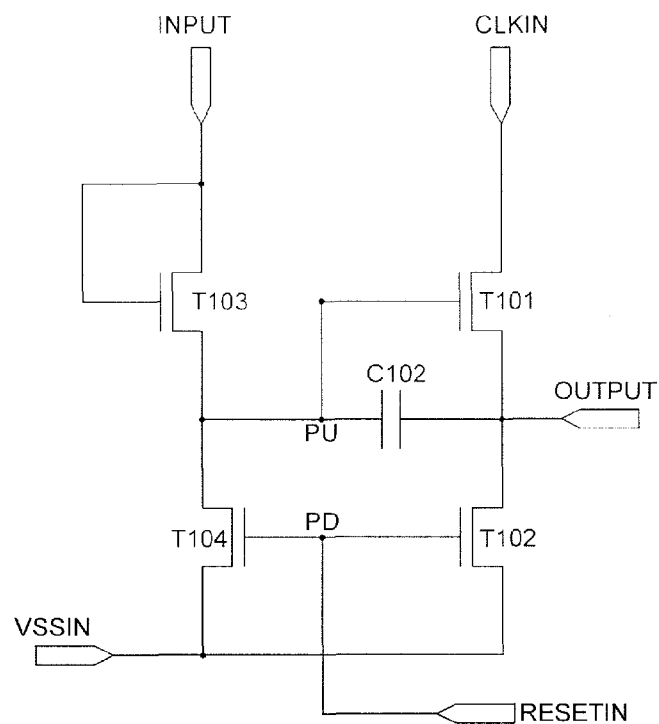
FIG. 1 is a schematic diagram showing a shift register in the prior art.
Figure 2:
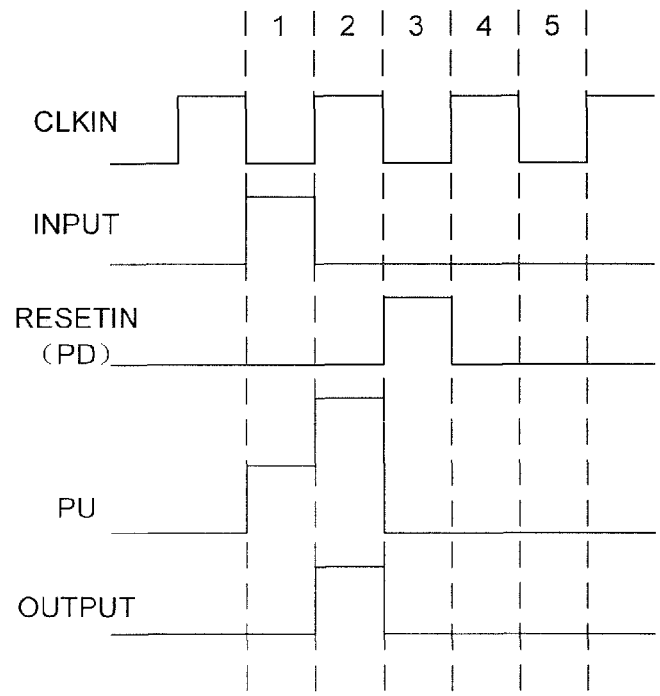
FIG. 2 is a timing diagram of inputs and outputs of the shift register in FIG. 1.
Figure 3:
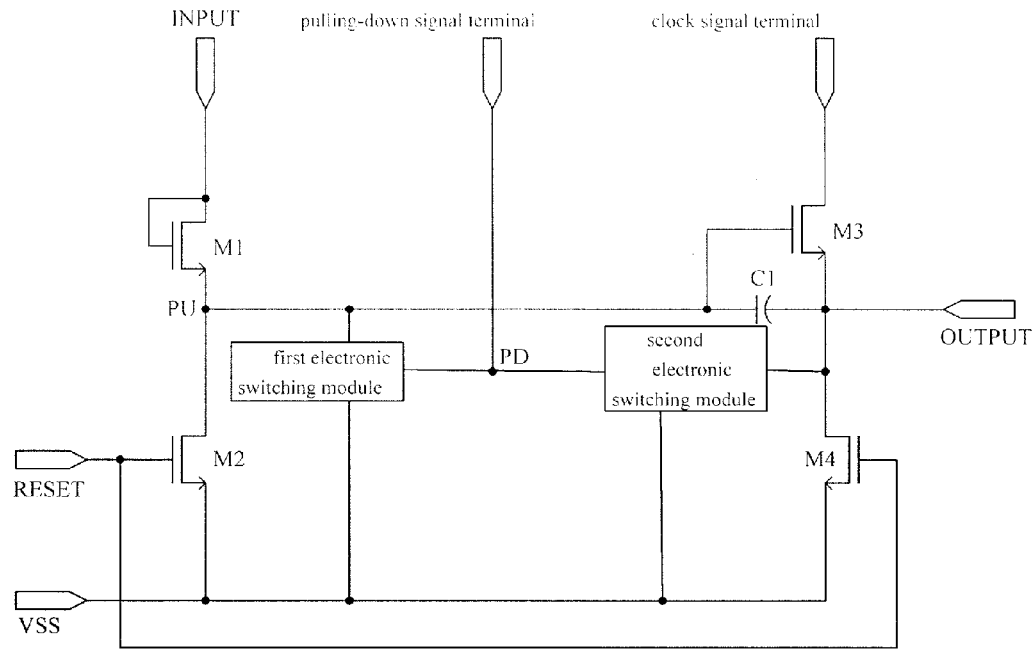
FIG. 3 is a first schematic diagram showing a shift register provided in an embodiment of the present invention.

A shift register provided in an embodiment of the present invention, as shown in FIG. 3, includes: a first Thin Film Transistor (TFT) M1 having a gate and a drain connected to a signal input terminal INPUT, a source connected to a pulling-up node PU; a second TFT M2 having a gate connected to a reset signal terminal RESET, a drain connected to the pulling-up node PU, and a source connected to a low level signal terminal VSS; a third TFT M3 having a gate connected to the pulling-up node PU, a drain connected to a clock signal terminal, and a source connected to a signal output terminal OUTPUT; a fourth TFT M4 having a gate connected to the reset signal terminal RESET, a drain connected to the signal output terminal OUTPUT, and a source connected to the low level signal terminal VSS; a capacitor C1 being connected between the pulling-up node PU and the signal output terminal OUTPUT.

Exemplarily, the shift register may further comprise:

a first electronic switching module, being connected between the pulling-up node PU and the low level signal terminal VSS, and connected to a pulling-down signal terminal via the pulling-down node PD, for maintaining the pulling-up node PU at a low level during a non-operating time of the shift register and when the pulling-down node PD is at a low level; and/or a second electronic switching module, being connected between the signal output terminal OUTPUT and the low level signal terminal VSS, and connected to a pulling-down signal terminal via the pulling-down node PD, for maintaining the signal output terminal OUTPUT at a low level during the non-operating time of the shift register and when the pulling-down node PD is at a low level.

In the shift register provided in the embodiment of the present invention, two electronic switching modules are added to the existing shift register, wherein one of the two electronic switching modules is arranged among the puling-down node PD, the low level signal terminal VSS, and the pulling-up node PU, and the other is arranged among the pulling-down node PD, the low level signal terminal VSS and the signal output terminal OUTPUT; during the non-operating time of the shift register and when the pulling-down node PD is at a low level, the two electronic switching modules are turned on, and discharge the pulling-up node PU and the signal output terminal OUTPUT respectively to pull down the noise voltage therein, thus effectively reducing the noise interference of the shift register during the non-operating time.

Figure 4:
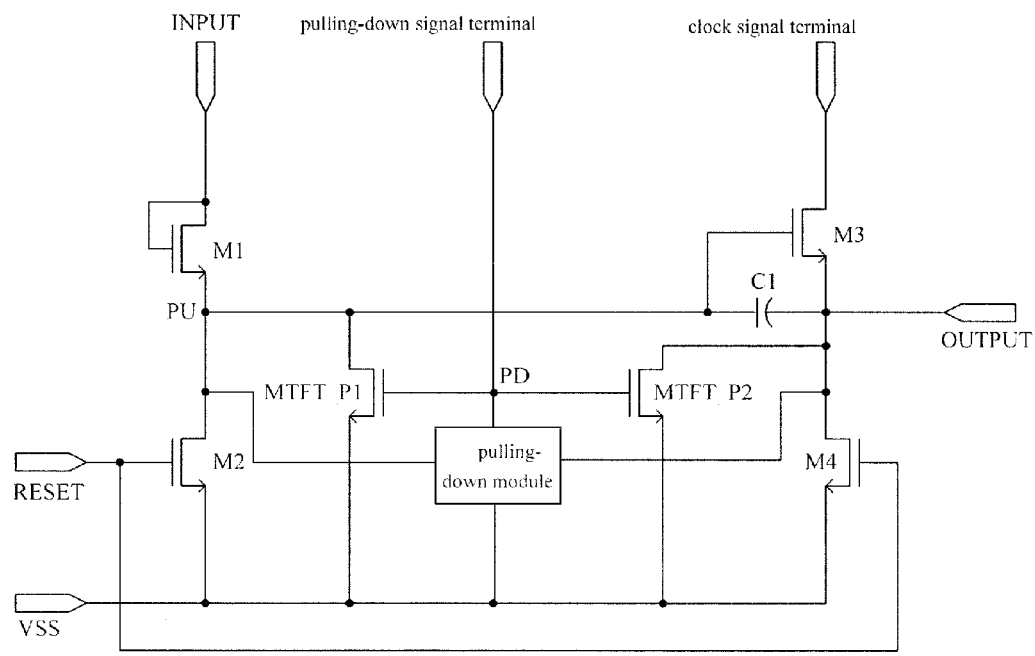
FIG. 4 is a second schematic diagram showing a shift register provided in an embodiment of the present invention.

Further, as shown in FIG. 4, the above first electronic switching module and the second electronic switching module can be embodied as two P type TFT devices, that is, the gates of the TFT devices are turned on at a low level signal, so that the two electronic switching modules are turned on when the pulling-down node PD is at a low level; wherein P type TFT device MTFT_P1 serving as the first electronic switching module has a gate connected to the pulling-up node PD, a drain connected to the pulling-up node PU, and a source connected to the low level signal terminal VSS; and P type TFT device MTFT_P2 serving as the second electronic switching module has a gate connected to the pulling-up node PD, a drain connected to the signal output terminal OUTPUT, and a source connected to the low level signal terminal VSS.

Naturally, in a specific implementation, MTFT_P1 and MTFT_P2 are of P type TFT devices which are in operation when the gates thereof are at a low level; other TFTs are of N type TFT devices which are in operation when the gates thereof are at a high level. A simpler method is that, in the case that the normal output of the shift register is not affected, the pulling-down signal remains at a high level at the time so that the MTFT_P1 and MTFT_P2 will not be turned on to operate. When it needs MTFT_P1 and/or MTFT_P2 to operate in normal, the pulling-down signal remains at a low level at all times.

Figure 5:
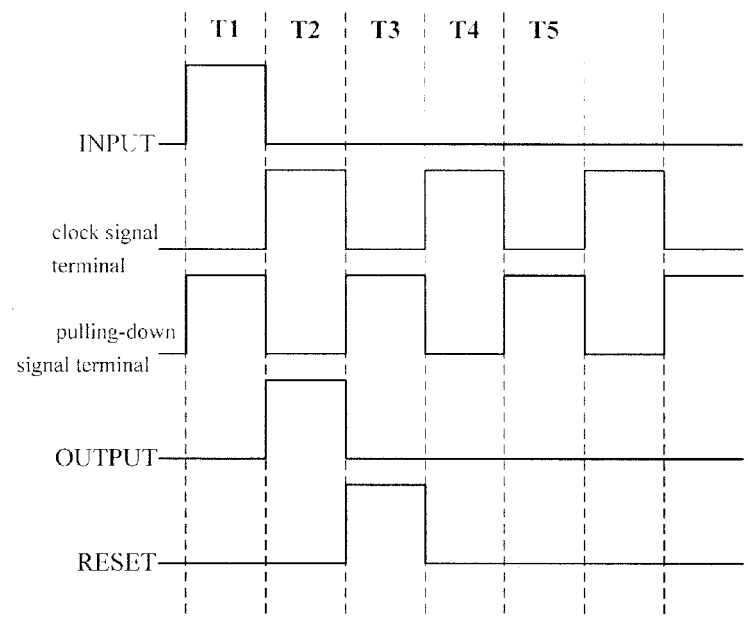
FIG. 5 is a timing sequence diagram of signals at the inputs and outputs of the shift register provided in an embodiment of the present invention.

In a specific implementation, the clock signal terminal and the pulling-down signal terminal of the shift register input clock signals alternatively and periodically, as shown in FIG. 5, when the signal input terminal INPUT is at a high level, the clock signal terminal is at a low level, and the pulling-down signal terminal is at a high level. Thus, when the pulling-down node PD connected to the pulling-down signal terminal is at a low level, MTFT_P1 and MTFT_P2 are turned on, so that the noise occurring at the pulling-up node PU and the signal output terminal OUTPUT can be output to the terminal VSS in time, and thus the noise voltage can be pulled down, ensuring that there is no noise output at the signal output terminal OUTPUT during the non-operating time of the shift register, and reducing the noise signal at the gate line connected to the signal output terminal OUTPUT.

Selectively, the clock signal and the pulling-down signal have an identical period and reverse phases. That is, when the clock signal is at a low level, the pulling-down signal is at a high level; and when the clock signal is at a high level, the pulling-up signal is at a low level.

Further, the above shift register provided in an embodiment of the present invention, as shown in FIG. 4, can include a pulling-down module being connected among the pulling-up node PU, the pulling-down node PD, the signal output terminal OUTPUT and the low level signal terminal VSS, for maintaining the pulling-up node PU and the signal output terminal OUTPUT at a low level during the non-operating time of the shift register and when the pulling-down node PD is at a high level.

Figure 6:
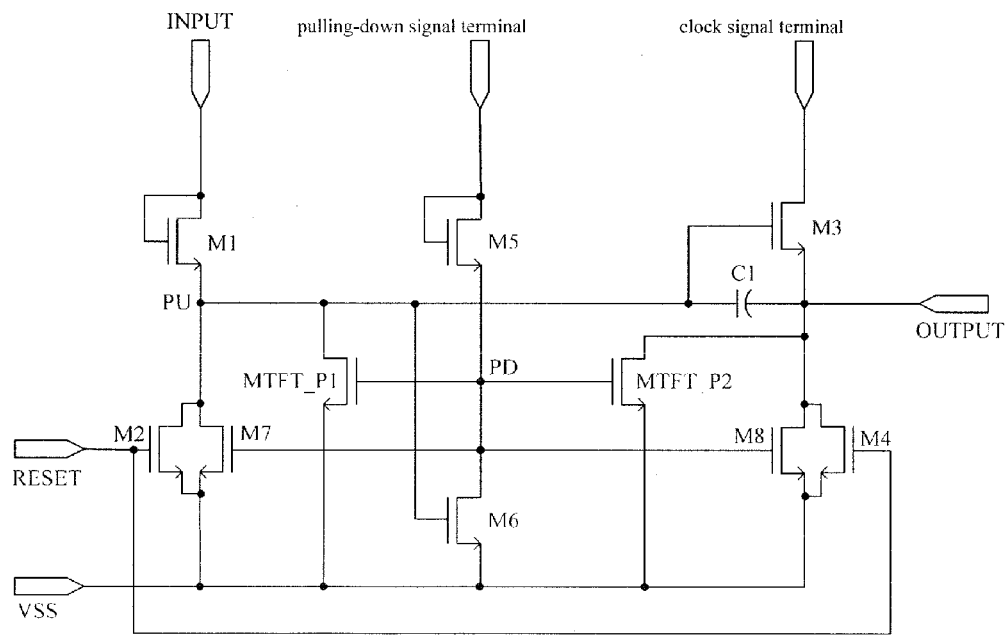
FIG. 6 is a third schematic diagram showing a shift register provided in an embodiment of the present invention.

In particular, the pulling-down module can comprise four TFT devices, as shown in FIG. 6, i.e., a fifth TFT M5, a sixth TFT M6, a seventh TFT M7 and an eighth TFT M8; wherein, the fifth TFT M5 has a gate and a drain connected to the pulling-down signal terminal, and a source connected to the pulling-down node PD; the sixth TFT M6 has a gate connected to the pulling-up node PU, a drain connected to the pulling-down node PD, and a source connected to the low level signal terminal VSS; the seventh TFT M7 has a gate connected to the pulling-down node PD, a drain connected to the pulling-up node PU, and a source connected to the low level signal terminal VSS; and the eighth TFT M8 has a gate connected to the pulling-down node PD, a drain connected to the signal output terminal OUTPUT, and a source connected to the low level signal terminal VSS.

In particular, only one of the above TFTs M8 and M7 can be adopted, or both of the TFT M8 and TFT M7 can be adopted in the pulling-down module, there is no limit to this.

In a specific implementation, the above first, second, third, fourth, fifth, sixth, seventh, and eight TFTs are of N type TFT devices which are turned on when the gates thereof are at a high level.

Hereinafter, the operating procedure of the shift register provided in the present invention is described with reference to the shift register shown in FIG. 6 and the timing sequence of signals at the inputs and outputs of the shift register shown in FIG. 5. In particular, five phases T1~T5 are selected in the timing diagram of the inputs and outputs shown in FIG. 5, wherein 1 represents a high level signal and 0 represents a low level signal.

During the phase T1, INPUT=1, CLK (the clock signal terminal)=0, CLKB (the pulling-down signal terminal)=1, and RESET=0. Since INPUT=1, the transistor M1 is turned on and controls the shift register to operate, and the signal input terminal INPUT pulls up the pulling-up node PU via M1 and charges the capacitor C1. Since CLKB=1, M5 is turned on, and the pulling-down node PD is pulled up to a high level. M6 is turned on and pulls down the pulling-down node PD to VSS since the pulling-up node PU is pulled up. Thus, M7 and M8 remain off so that M7 is prevented from pulling down the pulling-up node PU to VSS. When M5 pulls up the pulling-down node PD, M6 can pull down the node PD, and thus M5 and M6 constitute an inverter. When the pulling-up node PU is at a high level, M3 is turned on, and since CLK=0, the signal output terminal OUTPUT outputs a low level. The phase T1 is a phase for charging the capacitor C1 in the shift register.

During the phase T2, INPUT=0, CLK=1, CLKB=0, and RESET=0. Since INPUT=0, M1 is turned off, and the node PU is further pulled up by means of the bootstrap effect of capacitor C1. Since CLKB=0, M5 is turned off, and M6 is turned on and pulls down the node PD to VSS when the node PU is pulled up; therefore, the node PD remains at a low level. For CLK=1, M3 is turned on when the node PU is at a high level, and outputs the high level of CLK to the signal output terminal OUTPUT which in turn outputs the high level to one row of gate lines corresponding to the shift register, so that all the TFTs on the row of gate lines in the display area of the liquid crystal panel are turned on and data lines begin to write signals. The phase T2 is a phase for turning on the shift register.

During the phase T3, INPUT=0, CLK=0, CLKB=1, and RESET=1. Since RESET=1, M2 and M4 are turned on. In principle, the node PU would be pulled down to VSS when M2 is turned on and the signal output terminal OUTPUT would be pulled down to VSS when M4 is turned on, so that the signal output terminal OUTPUT would output a low level signal. Further, since CLKB=1, M5 is turned on so that the node PD is pulled up (at this point, the node PU is at a low level, so M6 is turned off). When the node PD is at a high level, M7 is turned on so that the node PU is pulled down to VSS, and M8 is turned on so that the signal output terminal OUTPUT is pulled down to VSS. As M8 and M8 can be turned on simultaneously and are able to make the signal output terminal OUTPUT be at a low level; in the case that one of the two TFTs M7 and M8 is damaged, the other can still maintain the signal output terminal at a low level. Such a configuration functions as a double insurance so as to prevent the signal output terminal Output from changing to a high level under the influence of the other interfering signals, turning on one row of gate lines under the control of the output signal terminal at a high level and finally resulting in the turning-on of the gate line in error.

Figure 8:
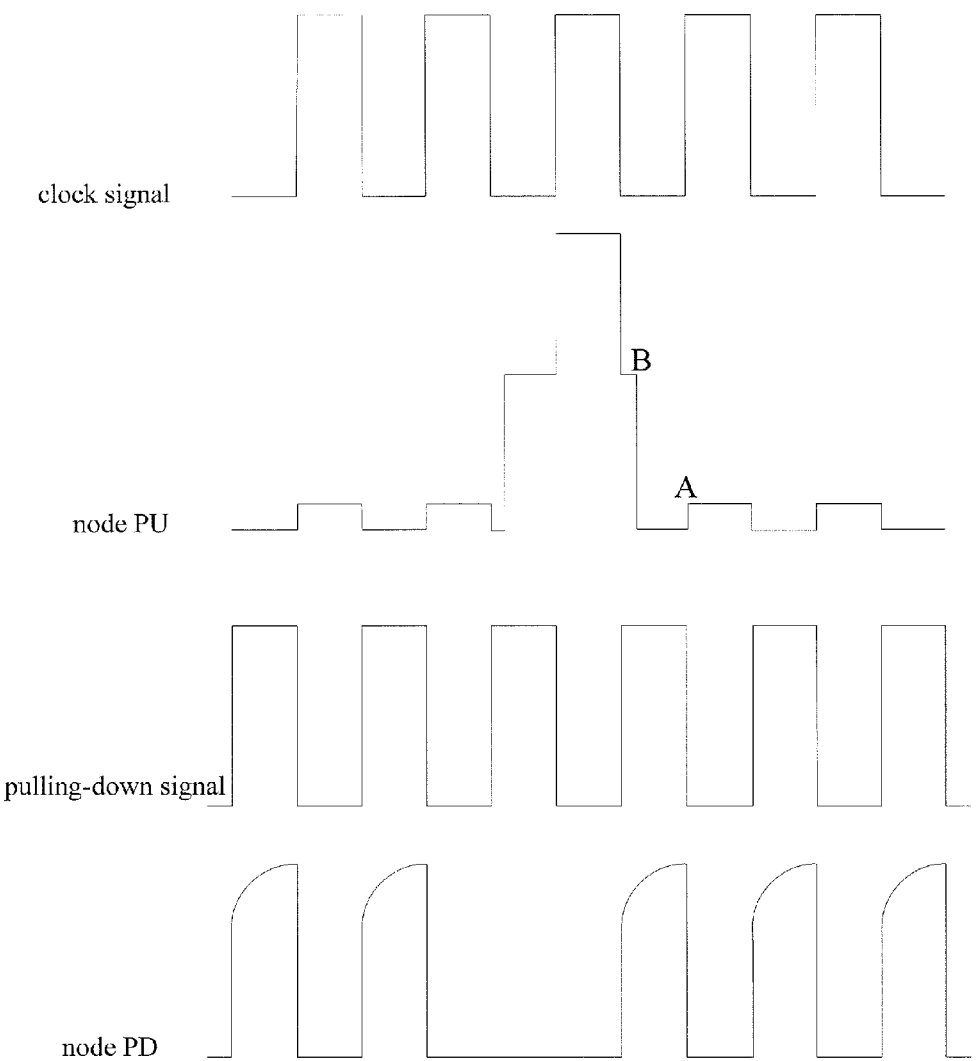
FIG. 8 is a timing sequence diagram of signals at the inputs and outputs of the shift register shown in FIG. 7.

Nevertheless, the actual timing change of the shift register is shown in FIG. 8. Since during the phase (phase T3), the voltage at the node PU changes from a high level to a low level gradually (point B in FIG. 8), and the state of M6 changes from on to off gradually; that is, the voltage at the node PD changes from a low level to a high level gradually, so that M7 and M8 can not be turned on immediately; as a result, it can not ensure that the noise at the node PU and that at the signal output terminal OUTPUT (in general, the noise occurs at the signal output terminal OUTPUT as that occurs at the node PU) are pulled down in time; meanwhile, when the pulling-down signal terminal charges and discharges the node PD alternatively, the node PD is at a low level, and MTFT_P1 and/or MTFT_P2 are (is) turned on, so that the noise occurring at the node PU and/or that at the signal output terminal OUTPUT are (is) output to the terminal VSS in time, thus the noise voltage at the node PU and that at the signal output terminal OUTPUT being pulled down.

During the phase T4, INPUT=0, CLK=1, CLKB=0, and RESET=0. Since CLKB=0 and RESET=0, M5, M2 and M4 are turned off, and the node PD remains at a high level, and thus M7 and M8 are turned on. The node PU is pulled down to VSS since M7 is turned on, and the signal output terminal OUTPUT is pulled down to VSS since M8 is turned on, so that the signal output terminal OUTPUT is prevented from changing to a high level under the influence of the other interfering signals, turning on one row of gate lines under the control of the output signal terminal at a high level and finally resulting in the turning-on of the gate line in error.

During the phase T5, INPUT=0, CLK=0, CLKB=1, and RESET=0. Since CLKB=1, M5 is turned on and the node PD remains at a high level, and thus M7 and M8 remain on. The node PU is pulled down to VSS since M7 is turned on, and the signal output terminal OUTPUT is pulled down to VSS since M8 is turned on, so that the signal output terminal OUTPUT is prevented from changing to a high level under the influence of the other interfering signals, turning on one row of gate lines under the control of the output signal terminal at a high level and finally resulting in the turning-on of the gate line in error.

After this, the shift register repeats the phases T4 and T5 until the signal input terminal INPUT is at a high level next time, wherein the phases T3~T5 can be referred to as the non-operating time of the shift register, and the phases T1~T2 can be referred to as the operating time of the shift register.

Actually, during the non-operating time of the shift register, i.e., T3~T5, the alternation of high level and low level in the signal at CLKB can result in the decrease in the voltage at the node PD, and in turn results in noise occurring at the node PU (as the point A shown in FIG. 8); by turning on MTFT_T1 and/or MTFT_T2 which are newly added, the noise occurring at the node PU and/or at the terminal OUTPUT can be output to the terminal VSS when the node PD is at a low level, thus the noise at the node PU and that at the terminal OUTPUT being pulled down.

Figure 7:
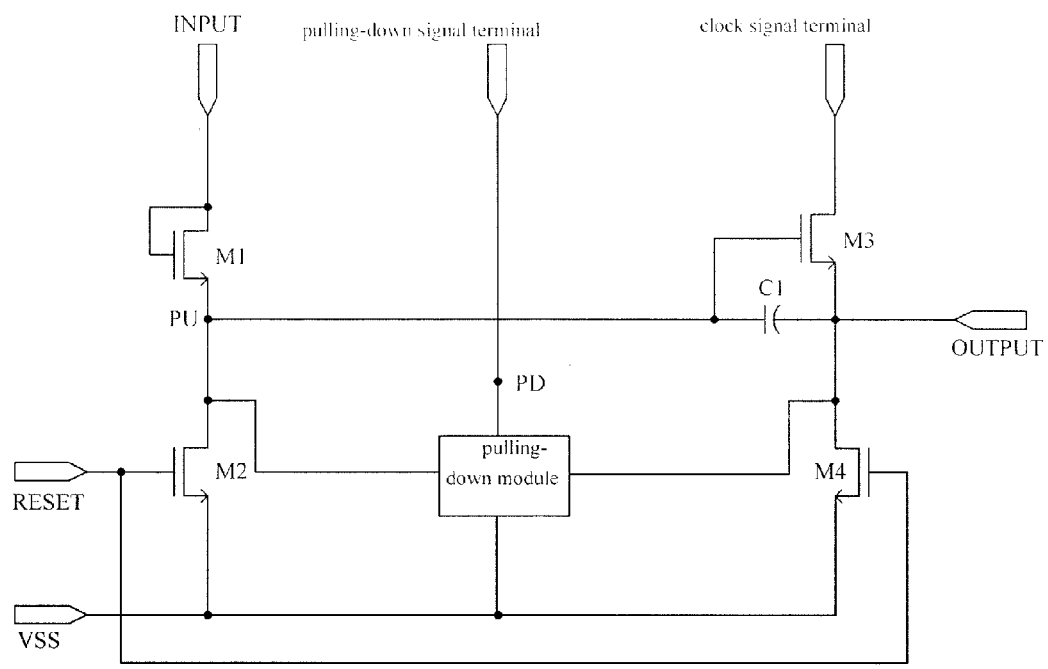
FIG. 7 is a schematic diagram showing a shift register with a pulling-down module in the prior art.

It can be seen from the above operating procedure by comparing the shift registers in FIGS. 4, 6 and 7 that in the shift register shown in FIG. 7, when an alternating current signal is selected as a pulling-down control signals, the node PD remains at the state of being charged for half of the non-operating time of the gate line, which although can effectively improve the lifespan of the individual TFTs in the pulling-down unit under the control of the node PD, the node PD is in an alternative state of being charged and being discharged; when the node PD is at a low level, the node PU and the terminal OUTPUT can not be pulled down in time when there occurs noise in node PU and the terminal OUTPUT, as the points A, B shown in FIG. 8; therefore, there easily occur the problems such as abnormal display or H-line. Compared to the shift register shown in FIG. 7, when the shift register shown in FIG. 4 or FIG. 6 is adopted, it can ensure that the shift register can not be affected during the procedure in which the node PU is charged by means of a ratio of MTFT_P1, MTFT_P2 to M6; and when the node PD which is connected to the pulling-down signal terminal is at a low level, MTFT_P1 and MTFT_P2 are turned on, and the noise occurring at the node PU and that at the terminal OUTPUT can be output to VSS in time, which pulls down the noise voltage at the node PU and that at the terminal OUTPUT, thus ensuring that no noise can be output from the terminal OUTPUT during the non-operative time of the shift register, and reducing the noise at the gate line to which the terminal OUTPUT is connected.

The above is only for the purpose of exemplarily illustrating the specific structure of the pulling-down module in the shift register, and in an implementation, the specific structure of the pulling-down module is not limited to the above structure provided in the embodiments of the present invention, and can be other structures known to those skilled in the art, without any limitation being imposed on this.

Figure 9:
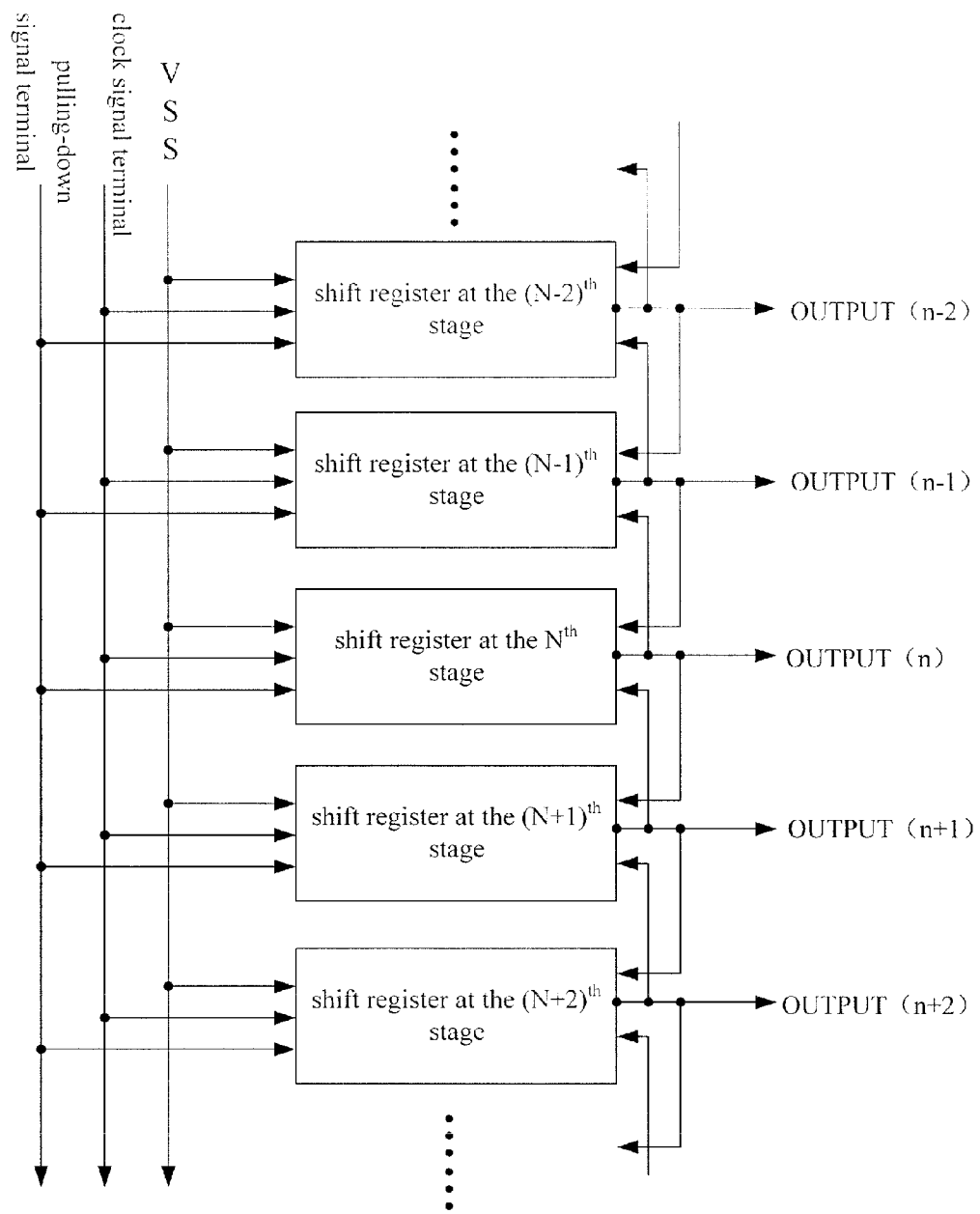
FIG. 9 is a schematic diagram showing an integrated gate line driving circuit provided in an embodiment of the present invention.

Based on the same inventive concept, an integrated gate line driving circuit is further provided in an embodiment of the present invention, as shown in FIG. 9, and comprises a plurality of shift registers connected in series, wherein except the first shift register and the last shift register, each of the other shift registers inputs a triggering signal to a signal input terminal of next adjacent shift register, and inputs a reset signal to a reset signal terminal of previous adjacent shift register; the first shift register inputs a triggering signal to a signal input terminal of the second shift register, and the last shift register inputs a reset signal to the reset signal terminal of its own and to the reset signal terminal of previous shift register.

For the sake of simplifying description, there are only five shift registers shown in FIG. 9, respectively, a shift register at the $(N-2)^{th}$ stage, a shift register at the $(N-1)^{th}$ stage, a shift register at the $N^{th}$ stage, a shift register at the $(N+1)^{th}$ stage, and a shift register at the $(N+2)^{th}$ stage, wherein the output terminal OUTPUT (n) of the shift register at the $N^{th}$ stage feeds back a signal to the shift register at the $(N-1)^{th}$ stage, and also outputs a triggering signal to the shift register at the $(N+1)^{th}$ stage.

In general, the signal input terminal of the first shift register inputs a frame start signal; the clock signal terminal of an odd shift register inputs a first clock signal for the system, and the pulling-down signal terminal inputs a second clock signal for the system; the clock signal terminal of an even shift register inputs the second clock signal for the system, and the pulling-down signal terminal inputs the first clock signal for the system, wherein the first clock signal and the second clock signal alternate periodically.

In particular, each of the shift registers in the integrated gate line driving circuit has the same structure and function as those of the shift register provided in the embodiments of the present invention, and the repeated description is omitted.

Based on the same inventive concept, an array substrate is provided in an embodiment of the present invention, comprising the above integrated gate line driving circuit, wherein the particular implementation can be referred to the description of the above integrated gate line driving circuit, and the same description is omitted.

Based on the same inventive concept, a display is provided in an embodiment of the present invention, comprising the above array substrate, wherein the particular implementation can be referred to the description of the above array substrate, and the same description is omitted.

In the shift register, the integrated gate line driving circuit, the array substrate and the display, two electronic switching modules are added to the existing shift register, wherein one of the two electronic switching modules is arranged among the puling-down node, the low level signal terminal and the pulling-up node, and the other is arranged among the pulling-down node, the low level signal terminal and the signal output terminal; during the non-operating time of the shift register and when the pulling-down node is at a low level, the two electronic switching modules are turned on, and discharge the pulling-up node and the signal output terminal respectively to pull down the noise therein, thus effectively reducing the noise interference of the shift register during the non-operating time.

It should be appreciated for those skilled in the art that many modifications, variations or equivalences can be made in the embodiments of the present invention without departing from the spirit and the scope of the invention. Thus, provided that all the modifications and variations belong to the scope as claimed in the present invention and the equivalent technical means, such modifications and variations fall into the protection scope of the present invention as defined by the appended claims.

What is claimed is:

1. A shift register comprising:
    a first Thin Film Transistor (TFT) having a gate and a drain directly connected to a signal input terminal, a source directly connected to a pulling-up node; a second TFT having a gate directly connected to a reset signal terminal, a drain directly connected to the pulling-up node, and a source directly connected to a low level signal terminal; a third TFT having a gate directly connected to the pulling-up node, a drain directly connected to a clock signal terminal, and a source directly connected to a signal output terminal; wherein the pulling-up node is further directly connected to a capacitor, a fourth TFT having a gate directly connected to the reset signal terminal, a drain directly connected to the signal output terminal, and a source directly connected to the low level signal terminal; the capacitor being directly connected between the pulling-up node and the signal output terminal; and a pulling-down module, being connected among the pulling-up node, the pulling-down node, the signal output terminal and the low level signal terminal, for maintaining the pulling-up node and the signal output terminal at a low level during the non-operating time of the shift register and when the pulling-down node is at a high level;

wherein the pulling-down module includes:

a fifth TFT having a gate and a drain directly connected to the pulling-down signal terminal, and a source directly connected to the pulling-down node;

a sixth TFT having a gate directly connected to the pulling-up node, a drain directly connected to the pulling-down node, and a source directly connected to the low level signal terminal; and a seventh TFT having a gate directly connected to the pulling-down node, a drain directly connected to the pulling-up node, and a source directly connected to the low level signal terminal, wherein the shift register further comprises:

a first electronic switching module, being connected between the pulling-up node and the low level signal terminal, and connected to a pulling-down signal terminal via a pulling-down node, for maintaining the pulling-up node at a low level during a non-operating time of the shift register and when the pulling-down node is at a low level; and a second electronic switching module, being connected between the signal output terminal and the low level signal terminal, and connected to the pulling-down signal terminal via the pulling-down node, for maintaining the signal output terminal at a low level during the non-operating time of the shift register and when the pulling-down node is at a low level, wherein the first Thin Film Transistor, the second Thin Film Transistor and the fourth Thin Film Transistor are turned off during a non-operating time of the shift register.

2. The shift register according to claim 1, wherein the first electronic switching module is of P type TFT device, wherein the gate of the TFT device is connected to the pulling-down node, the drain thereof is connected to the pulling-up node, and the source thereof is connected to the low level signal terminal; and the second electronic switching module is of P type TFT device, wherein the gate of the TFT device is connected to the pulling-down node, the drain thereof is connected to the signal output terminal, and the source thereof is connected to the low level signal terminal.

3. The shift register according to claim 1, wherein the pulling-down module further includes:

an eighth TFT having a gate connected to the pulling-down node, a drain connected to the signal output terminal, and a source connected to the low level signal terminal.

4. The shift register according to claim 3, wherein the first, second, third, fourth, fifth, sixth, seventh, and eight TFTs are of N type TFT devices.

5. The shift register according to claim 1, wherein the clock signal terminal and the pulling-down signal terminal of the shift register clock input clock signals alternatively and periodically, wherein when the signal input terminal is at a high level, the clock signal terminal is at a low level, and the pulling-down signal terminal is at a high level.

6. An integrated gate line driving circuit comprising a plurality of shift registers connected in series, wherein except a first shift register and a last shift register, each of other shift registers inputs a triggering signal to a signal input terminal of next adjacent shift register, and inputs a reset signal to a reset signal terminal of previous adjacent shift register; the first shift register inputs a triggering signal to a signal input terminal of a second shift register, and the last shift register inputs a reset signal to a reset signal terminal of its own and to a reset signal terminal of previous shift register, wherein the shift register comprises:

a first Thin Film Transistor (TFT) having a gate and a drain directly connected to a signal input terminal, a source directly connected to a pulling-up node;

a second TFT having a gate directly connected to a reset signal terminal, a drain directly connected to the pulling-up node, and a source directly connected to a low level signal terminal; a third TFT having a gate directly connected to the pulling-up node, a drain directly connected to a clock signal terminal, and a source directly connected to a signal output terminal; a fourth TFT having a gate directly connected to the reset signal terminal, a drain directly connected to the signal output terminal, and a source directly connected to the low level signal terminal;

a capacitor being directly connected between the pulling-up node and the signal output terminal; and a pulling-down module being connected among the pulling-up node, the pulling-down node, the signal output terminal and the low level signal terminal, for maintaining the pulling-up node and the signal output terminal at a low level during the non-operating time of the shift register and when the pulling-down node is at a high level;

wherein the pulling-down module includes:

a fifth TFT having a gate and a drain connected to the pulling-down signal terminal, and a source connected to the pulling-down node;

a sixth TFT having a gate connected to the pulling-up node, a drain connected to the pulling-down node, and a source connected to the low level signal terminal; and a seventh TFT having a gate connected to the pulling-down node, a drain connected to the pulling-up node, and a source connected to the low level signal terminal, wherein the shift register further comprises:

a first electronic switching module, being connected between the pulling-up node and the low level signal terminal, and connected to a pulling-down signal terminal via a pulling-down node, for maintaining the pulling-up node at a low level during a non-operating time of the shift register and when the pulling-down node is at a low level; and a second electronic switching module, being connected between the signal output terminal and the low level signal terminal, and connected to the pulling-down signal terminal via the pulling-down node, for maintaining the signal output terminal at a low level during the non-operating time of the shift register and when the pulling-down node is at a low level, wherein the first Thin Film Transistor, the second Thin Film Transistor and the fourth Thin Film Transistor are turned off during a non-operating time of the shift register.

7. The shift register according to claim 6, wherein the first electronic switching module is of P type TFT device, wherein the gate of the TFT device is connected to the pulling-down node, the drain thereof is connected to the pulling-up node, and the source thereof is connected to the low level signal terminal; and the second electronic switching module is of P type TFT device, wherein the gate of the TFT device is connected to the pulling-down node, the drain thereof is connected to the signal output terminal, and the source thereof is connected to the low level signal terminal.

8. The shift register according to claim 6, wherein the shift register further comprises a pulling-down module being connected among the pulling-up node, the pulling-down node, the signal output terminal and the low level signal terminal, for maintaining the pulling-up node and the signal output terminal at a low level during the non-operating time of the shift register and when the pulling-down node is at a high level.

9. The shift register according to claim 6, wherein the pulling-down module further includes:

an eighth TFT having a gate connected to the pulling-down node, a drain connected to the signal output terminal, and a source connected to the low level signal terminal.

10. The shift register according to claim 9, wherein the first, second, third, fourth, fifth, sixth, seventh, and eight TFTs are of N type TFT devices.

11. The shift register according to claim 6, wherein the clock signal terminal and the pulling-down signal terminal of the shift register clock input clock signals alternatively and periodically, wherein when the signal input terminal is at a high level, the clock signal terminal is at a low level, and the pulling-down signal terminal is at a high level.

12. An array substrate comprising the integrated gate line driving circuit according to claim 6.

13. A display comprising the array substrate according to claim 12.

\* \* \* \* \*